US006962879B2

United States Patent
Zhu et al.

(10) Patent No.: US 6,962,879 B2
(45) Date of Patent: Nov. 8, 2005

(54) METHOD OF PLASMA ETCHING SILICON NITRIDE

(75) Inventors: Helen H. Zhu, Fremont, CA (US); David R. Pirkle, Soquel, CA (US); S. M. Reza Sadjadi, Saratoga, CA (US); Andrew S. Li, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/820,694

(22) Filed: Mar. 30, 2001

(65) Prior Publication Data

US 2002/0182880 A1 Dec. 5, 2002

(51) Int. Cl.[7] .......................................... H01L 21/302
(52) U.S. Cl. ...................... 438/724; 438/714; 438/729; 438/744
(58) Field of Search ................ 438/714, 724, 438/729, 744, 624, 634, FOR 401, 733, 740, 709, 707, 723

(56) References Cited

U.S. PATENT DOCUMENTS

| | | | | |
|---|---|---|---|---|
| 4,654,114 A | * | 3/1987 | Kadomura | ................... 438/744 |
| 5,611,888 A | | 3/1997 | Bosch et al. | |
| 5,786,276 A | * | 7/1998 | Brooks et al. | .............. 438/724 |
| 5,790,365 A | | 8/1998 | Shel | |
| 5,820,723 A | | 10/1998 | Benjamin et al. | |
| 6,057,244 A | | 5/2000 | Hausmann et al. | |
| 6,090,304 A | | 7/2000 | Zhu et al. | |
| 6,143,641 A | | 11/2000 | Kitch | |
| 6,153,514 A | | 11/2000 | Wang et al. | |
| 6,156,642 A | | 12/2000 | Wu et al. | |
| 6,355,573 B1 | * | 3/2002 | Okumura et al. | ............ 438/709 |
| 6,362,109 B1 | * | 3/2002 | Kim et al. | .................. 438/706 |
| 6,380,096 B2 | * | 4/2002 | Hung et al. | ................. 438/723 |
| 6,793,835 B2 | * | 9/2004 | Luo et al. | ...................... 216/79 |
| 2003/0079983 A1 | * | 5/2003 | Long et al. | ................. 204/164 |

FOREIGN PATENT DOCUMENTS

EP  0908940  4/1999

* cited by examiner

Primary Examiner—George Fourson
Assistant Examiner—Julio Maldonado
(74) Attorney, Agent, or Firm—Buchanan Ingersoll PC

(57) ABSTRACT

A semiconductor manufacturing process wherein silicon nitride is plasma etched with selectivity to an overlying and/or underlying dielectric layer such as a silicon oxide or low-k material. The etchant gas includes a fluorocarbon reactant and an oxygen reactant, the ratio of the flow rate of the oxygen reactant to that of the fluorocarbon reactant being no greater than 1.5. The etch rate of the silicon nitride can be at least 5 times higher than that of the oxide. Using a combination of $CH_3F$ and $O_2$ with optional carrier gasses such as Ar and/or $N_2$, it is possible to obtain nitride:oxide etch rate selectivities of over 40:1. The process is useful for simultaneously removing silicon nitride in 0.25 micron and smaller contact or via openings and wide trenches in forming structures such as damascene and self-aligned structures.

30 Claims, 7 Drawing Sheets

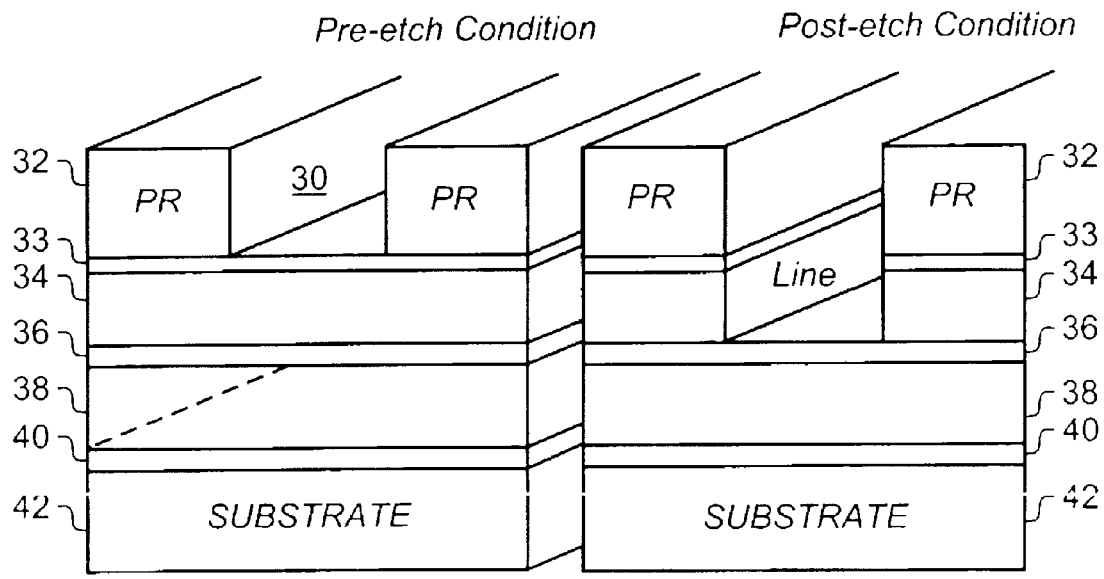
FIG. 2A — Pre-etch Condition
FIG. 2B — Post-etch Condition
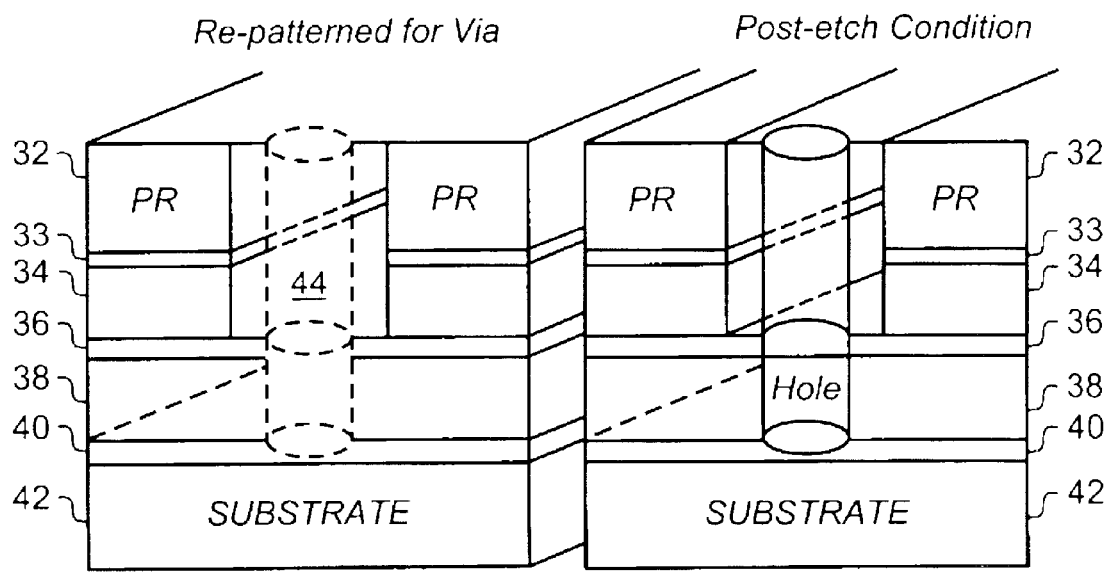
FIG. 2C — Re-patterned for Via
FIG. 2D — Post-etch Condition Pre-etch Condition Post-etch Condition

METHOD OF PLASMA ETCHING SILICON NITRIDE

FIELD OF THE INVENTION

The present invention relates to an improved method for plasma etching silicon nitride in the fabrication of integrated circuits.

BACKGROUND OF THE INVENTION

A process of plasma etching silicon nitride from a multilayer structure is disclosed in European Patent Publication EP 908940 A2. According to this publication, an etchant gas comprising 4–20 volume % of a fluorocarbon gas, (i.e., $CF_4$, $C_2F_6$, $C_3F_8$), 10–30 volume % of a hydrogen source (i.e., $CH_2F_2$, $CH_3F$, $H_2$), and 40–70 volume % of a weak oxidant (i.e., CO, $CO_2$, $O_2$) is excited to form a high density plasma (i.e., above $10^{11}$ ions/cm$^3$) and the plasma is used to etch a nitride layer located between a silicon substrate and an oxide or photoresist overlayer.

U.S. Pat. No. 6,153,514 discloses a method of forming a self-aligned dual damascene structure which includes a lower conductive layer (e.g., copper or copper alloy), a first etch stop layer (e.g., silicon nitride), a first dielectric layer (e.g., low k dielectric material wherein k<4), a second etch stop layer (e.g., silicon nitride), a second dielectric layer (e.g., low k dielectric material), a hard mask layer (e.g., silicon nitride), and a photoresist layer patterned to provide the feature to be etched into the second dielectric layer. According to this patent, the nitride hard mask layer is etched with $CHF_3/N_2$, the second dielectric layer is etched with $N_2/H_2O_2$ or $N_2/H_2$, the second etch stop layer is etched with $CHF_3/N_2$ and the first dielectric layer is etched with $C_4F_8/Ar/O_2/CO$. U.S. Pat. No. 5,611,888 discloses a method of plasma etching silicon nitride using a mixture of 10–20 sccm Freon 23 ($CHF_3$) and 70–110 sccm $O_2$.

U.S. Pat. No. 6,156,642 discloses a dual damascene structure wherein a semiconductor substrate includes a bottom metallization layer (e.g., copper), a topping layer (e.g., silicon nitride), a dielectric layer (e.g., silicon oxide or other low k material), a conformal layer (e.g., titanium, titanium nitride, tantalum, tantalum nitride, tungsten nitride) covering sidewalls of a trench and via hole, and a passivation layer (e.g., silicon nitride or silicon carbide). U.S. Pat. No. 6,143,641 discloses a dual damascene structure in an integrated circuit structure which includes an intermetal dielectric material (e.g., $SiO_2$) on an underlying conductive material (e.g., aluminum or copper), an adhesion layer (e.g., Ti, TiN, Ta) on exposed sidewalls of the dual damascene via structure which is filled with copper, a barrier metal or layer of silicon nitride, and additional layers including a low k dielectric material, silicon dioxide and silicon nitride.

U.S. Pat. No. 5,786,276 discloses a chemical downstream etching technique intended to be selective to silicon nitride over silicon oxide using a $CH_3F/CF_4/O_2$ recipe and a $CH_2F_2/CF_4/O_2$ recipe.

As device geometries become smaller and smaller, the need for high etch selectivity is even greater in order to achieve plasma etching of openings in dielectric layers such as silicon nitride. Accordingly, there is a need in the art for a plasma etching technique which provides high etch selectivity.

SUMMARY OF THE INVENTION

The invention provides a process for plasma etching silicon nitride layer with selectivity to an overlying and/or underlying dielectric layer, comprising the steps of introducing the semiconductor substrate into a plasma etching chamber, supplying etching gas to the chamber and energizing the etching gas into a plasma state, and etching openings in the silicon nitride layer with the plasma. The etching gas includes a fluorocarbon reactant, an oxygen reactant and an optional inert carrier gas, the oxgen:fluorocarbon flow rate ratio being 1.5 or less.

According to one aspect of the invention, the underlying and/or overlying dielectric layer comprises a doped or undoped silicon dioxide, BPSG, PSG, TEOS, thermal silicon oxide or organic low-k material such as SiLK. The openings can comprise open trenches or grooves corresponding to a conductor pattern, via openings or contact openings. The silicon nitride etching gas can include a hydrogen-containing and/or a hydrogen-free fluorocarbon reactant represented by $C_xF_yH_z$, wherein x is at least 1, y is at least 1 and z is equal to or greater than 0. For example, the fluorocarbon reactant can be a $C_xF_y$ gas (wherein $x \geq 1$ and $y \geq 1$) selected from the group of $CF_4$, $C_2F_6$, $C_4F_8$, $C_5F_8$, $C_3F_6$, $C_3F_8$, $C_4F_6$, $CH_3F$, $C_2HF_5$, $CHF_3$, $C_2H_4F_6$ and/or $CH_2F_2$. The semiconductor substrate can include an electrically conductive or semiconductive layer such as a metal-containing layer selected from the group consisting of Al, Al alloys, Cu, Cu alloys, Ti, Ti alloys, doped or undoped polycrystalline or single crystal silicon, TiN, TiW, Mo, suicides of Ti, W, Co and/or Mo or alloys thereof, etc.

In a preferred embodiment, the process of the invention can be used to etch openings which are 0.30 μm, especially 0.25 μm or smaller sized openings using a fluorocarbon reactant which comprises $C_xF_yH_z$ wherein x is 1 to 5, y is 1 to 8 and z is 0 to 3. As an example, the fluorocarbon reactant can comprise one or more gases selected from $CH_3F$, $C_2HF_5$, $CH_2F_2$, $C_2F_6$, $C_3F_6$, $C_4F_6$, $C_4F_8$, $C_5F_8$ and mixtures thereof. For example, the fluorocarbon reactant can comprise $CH_3F$ with or without a hydrogen-free fluorocarbon. The optional carrier gas can be selected from the group consisting of Ar, He, Ne, Kr, Xe or mixtures thereof. In a single wafer plasma etch chamber for processing 200 mm wafers, the oxygen reactant can be supplied as $O_2$ or as an oxygen-containing gas such as CO to the plasma reactor at a flow rate of 15 to 100 sccm, the fluorocarbon reactant can be supplied to the plasma reactor at a flow rate of 15 to 200 sccm, and the optional carrier gas can be supplied to the plasma reactor at a flow rate of 10 to 500 sccm. As an example, oxygen, $CH_3F$, and Ar can be supplied to the plasma reactor at flow rates of 15 to 60 sccm, 15 to 60 sccm and 0 to 500 sccm, respectively. During the etching step, the plasma reactor is preferably maintained at a vacuum pressure of 5 to 1000 mTorr, preferably 100 to 500 mTorr in the case of a medium density plasma reactor. The etching step can be preceded and/or followed by additional etching steps and subsequent filling of the openings with metal. The method of the invention can also include steps of forming a photoresist layer on the substrate, patterning the photoresist layer to form a plurality of openings followed by etching a metallization pattern of conductor lines, via or contact openings in the overlying oxide layer.

BRIEF DESCRIPTION OF THE DRAWINGS

FIGS. 2A–D show schematic representations of a trench-first dual-damascene structure which can be etched according to the process of the invention, FIG. 2A showing a pre-etch condition, FIG. 2B showing a post-etch condition in which a trench has been etched, FIG. 2C showing the structure re-patterned for a via etch and FIG. 2D showing a post-etch condition in which the via has been etched;

DETAILED DESCRIPTION OF THE INVENTION

The invention provides a semiconductor manufacturing process wherein openings can be plasma etched in thin silicon nitride layers while providing desired selectivity to underlying and/or overlying dielectric layers. Such selectivity is of great interest in the manufacture of damascene structures wherein one or more silicon nitride layers are incorporated in a multilayer structure. During manufacture of such structures, features such as contacts, vias, conductor lines, etc., are etched in dielectric materials such as oxide layers in the manufacture of integrated circuits. The invention overcomes a problem with prior etching techniques wherein the selectivity between the silicon nitride etch rate and the underlying and/or overlying dielectric layers was too low for commercial applications. Such selectivity problems are solved by utilizing an etching gas chemistry which reduces the etch rates of the dielectric layers.

Figures 1A, 1B:
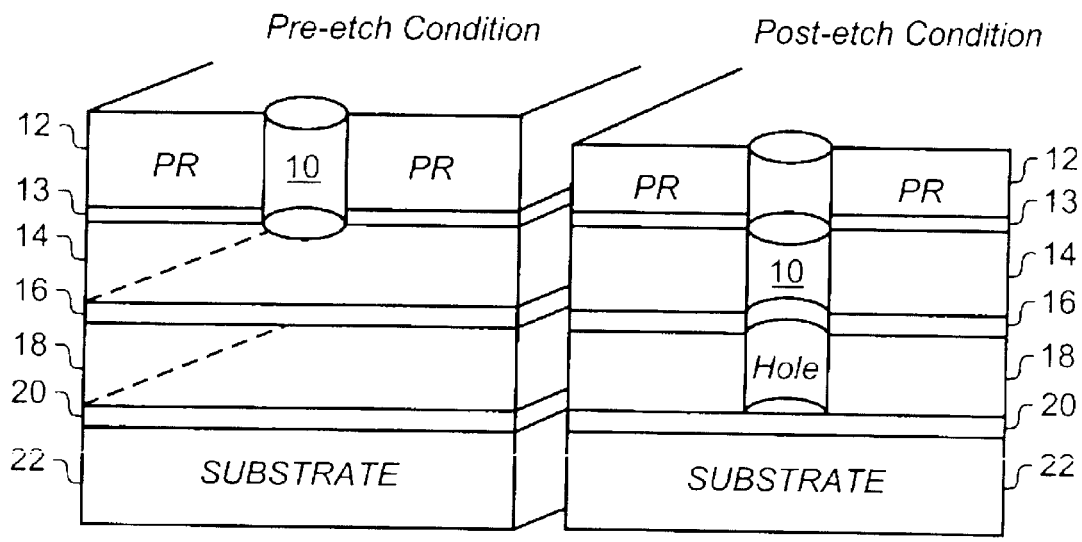
FIGS. 1A–D show schematic representations of a via-first dual-damascene structure which can be etched according to the process of the invention, FIG. 1A showing a pre-etch condition, FIG. 1B showing a post-etch condition in which a via has been etched, FIG. 1C showing the structure re-patterned for a trench etch and FIG. 1D showing a post-etch condition in which the trench has been etched.
Figures 1C, 1D:
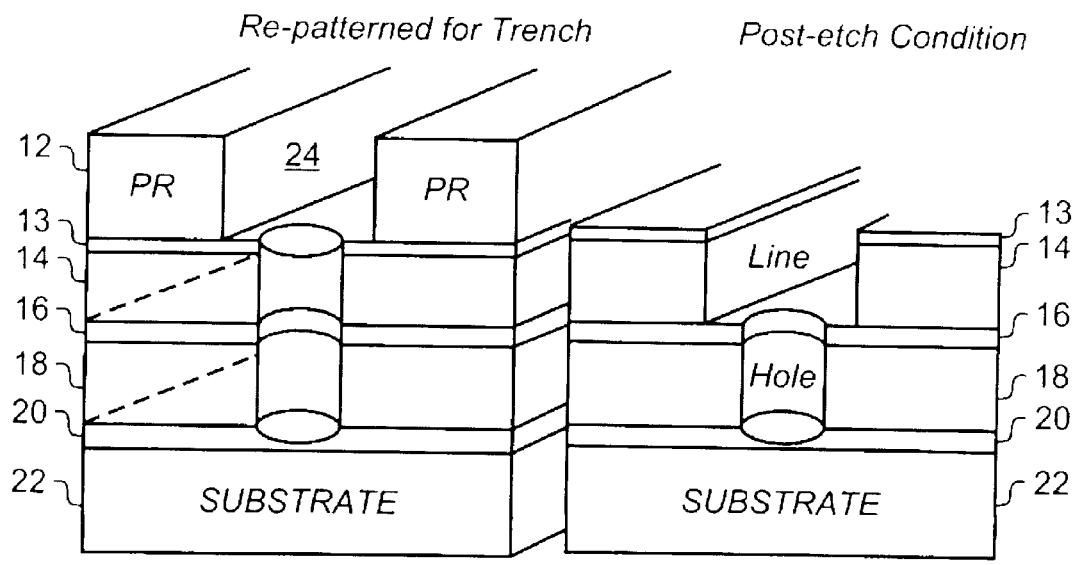

FIGS. 1A–D show schematics of how a via-first dual-damascene structure can be etched in accordance with the invention. FIG. 1A shows a pre-etch condition wherein an opening 10 corresponding to a via is provided in a photoresist masking layer 12 which overlies a stack of a first dielectric layer 14 such as silicon oxide, a first stop layer 16 such as silicon nitride, a second dielectric layer 18 such as silicon oxide, a second stop layer 20 such as silicon nitride, and a substrate 22 such as a silicon wafer. FIG. 1B shows the structure after etching wherein the opening 10 extends through the dielectric layers 14, 18 and first stop layer 16 to the second stop layer 20. FIG. 1C shows the structure after re-patterning the masking layer for a trench 24. FIG. 1D shows the structure after etching wherein the first dielectric layer 14 is etched down to the first stop layer 16.

FIGS. 2A–D show schematics of how a trench-first dual-damascene structure can be etched in accordance with the invention. FIG. 2A shows a pre-etch condition wherein an opening 30 corresponding to a trench is provided in a photoresist masking layer 32 which overlies a stack of a first dielectric layer 34 such as silicon oxide, a first stop layer 36 such as silicon nitride, a second dielectric layer 38 such as silicon oxide, a second stop layer 40 such as silicon nitride, and a substrate 42 such as a silicon wafer. FIG. 2B shows the structure after etching wherein the opening 30 extends through the dielectric layer 34 to the first stop layer 36. FIG. 2C shows the structure after re-patterning the masking layer for a via 44. FIG. 2D shows the structure after etching wherein the second dielectric layer 38 is etched down to the second stop layer 40.

Figure 3A:
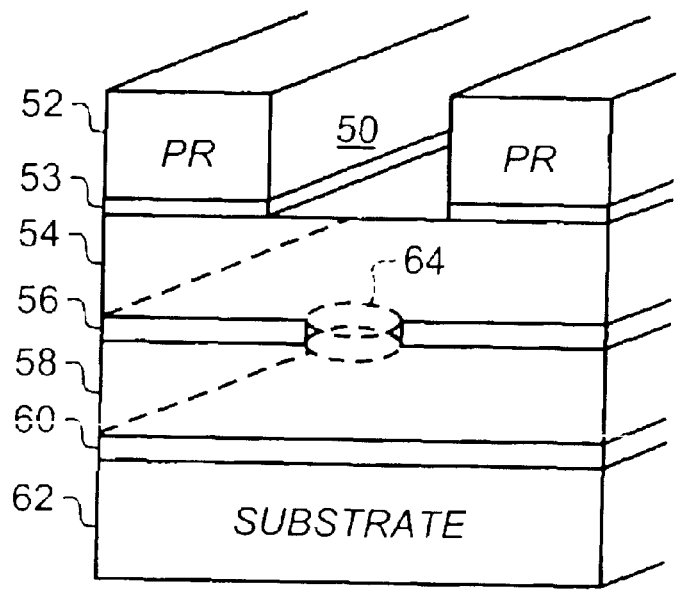
FIGS. 3A–B show schematic representations of a self-aligned dual-damascene structure which can be etched according to the process of the invention, FIG. 3A showing a pre-etch condition and FIG. 3B showing a post-etch condition in which a trench and a via have been etched.
Figure 3B:
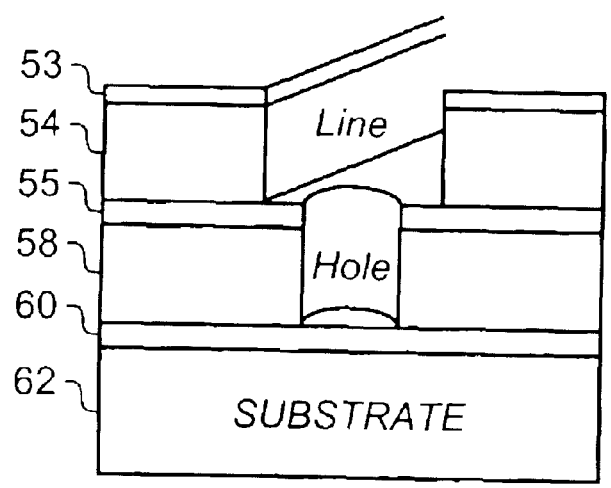

FIGS. 3A–B show schematics of how a dual-damascene structure can be etched in a single step in accordance with the invention. FIG. 3A shows a pre-etch condition wherein an opening 50 corresponding to a trench is provided in a photoresist masking layer 52 which overlies a stack of a first dielectric layer 54 such as silicon oxide, a first stop layer 56 such as silicon nitride, a second dielectric layer 58 such as silicon oxide, a second stop layer 60 such as silicon nitride, and a substrate 62 such as a silicon wafer. In order to obtain etching of vias through the first stop layer 56 in a single etching step, first stop layer 56 includes an opening 64. FIG. 3B shows the structure after etching wherein the opening 50 extends through the dielectric layer 54 to the first stop layer 56 and the opening 64 extends through the second dielectric 58 to the second stop layer 60. Such an arrangement can be referred to as a "self-aligned dual-damascene" structure.

The process of the invention is particularly useful in manufacturing multilayer structures which include various low-k dielectric layers including doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), c-doped silica glass such as CORAL (a product available from Novellus Systems, Inc.), or other suitable dielectric material having a dielectric constant below 4.0, preferably below 3.0. Such low-k dielectric layers can overlie an intermediate layer such as a barrier layer and a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

The plasma for carrying out the silicon nitride etch can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

Figure 4:
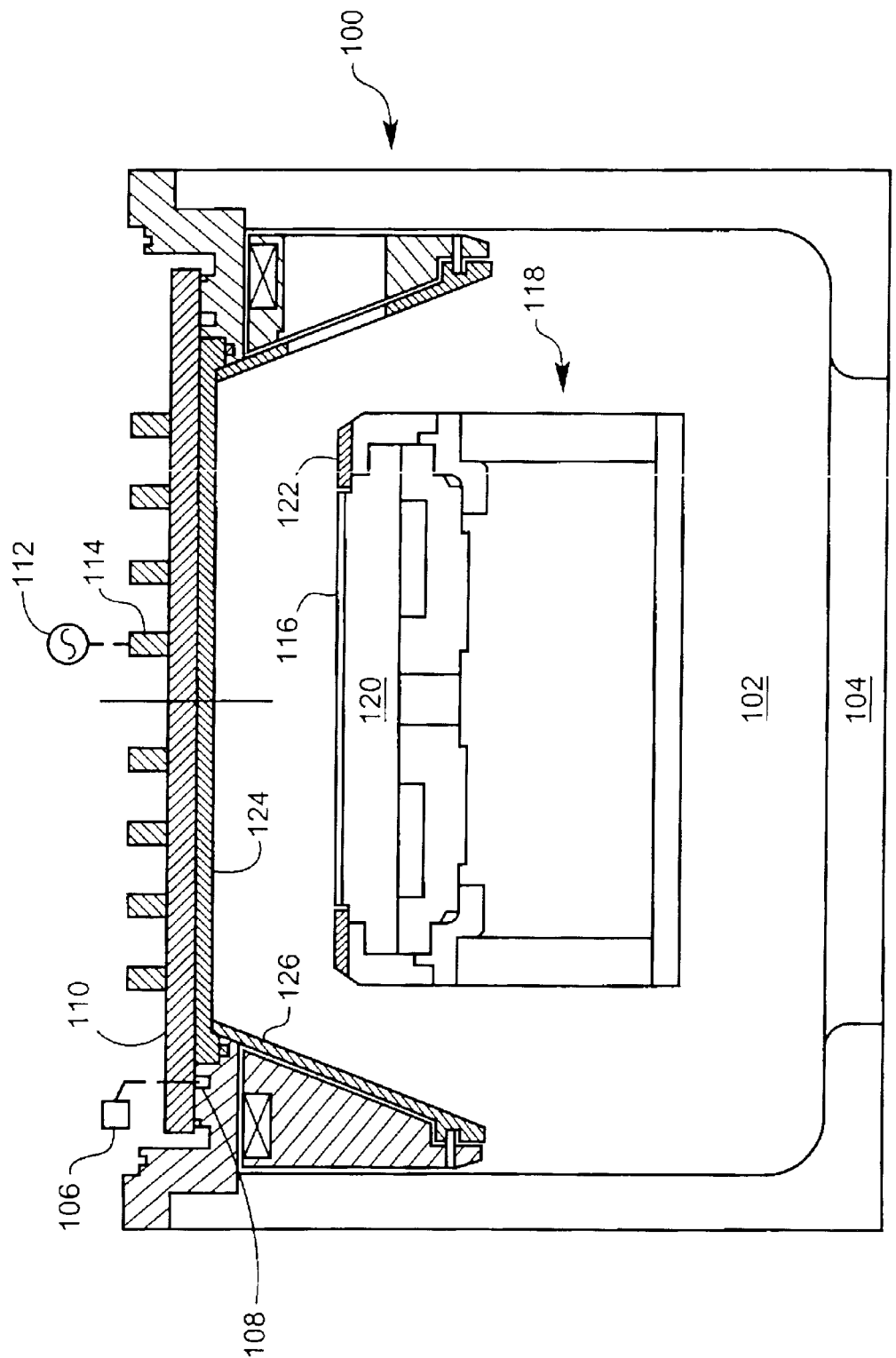
FIG. 4 shows a schematic representation of an inductively coupled high density plasma reactor which can be used to carry out the process of the invention.

The process of the invention can be carried out in an inductively coupled plasma reactor such as reactor 100 shown in FIG. 4. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a cylindrical or conical heated liner 126 extending from the plate 124.

Figure 5:
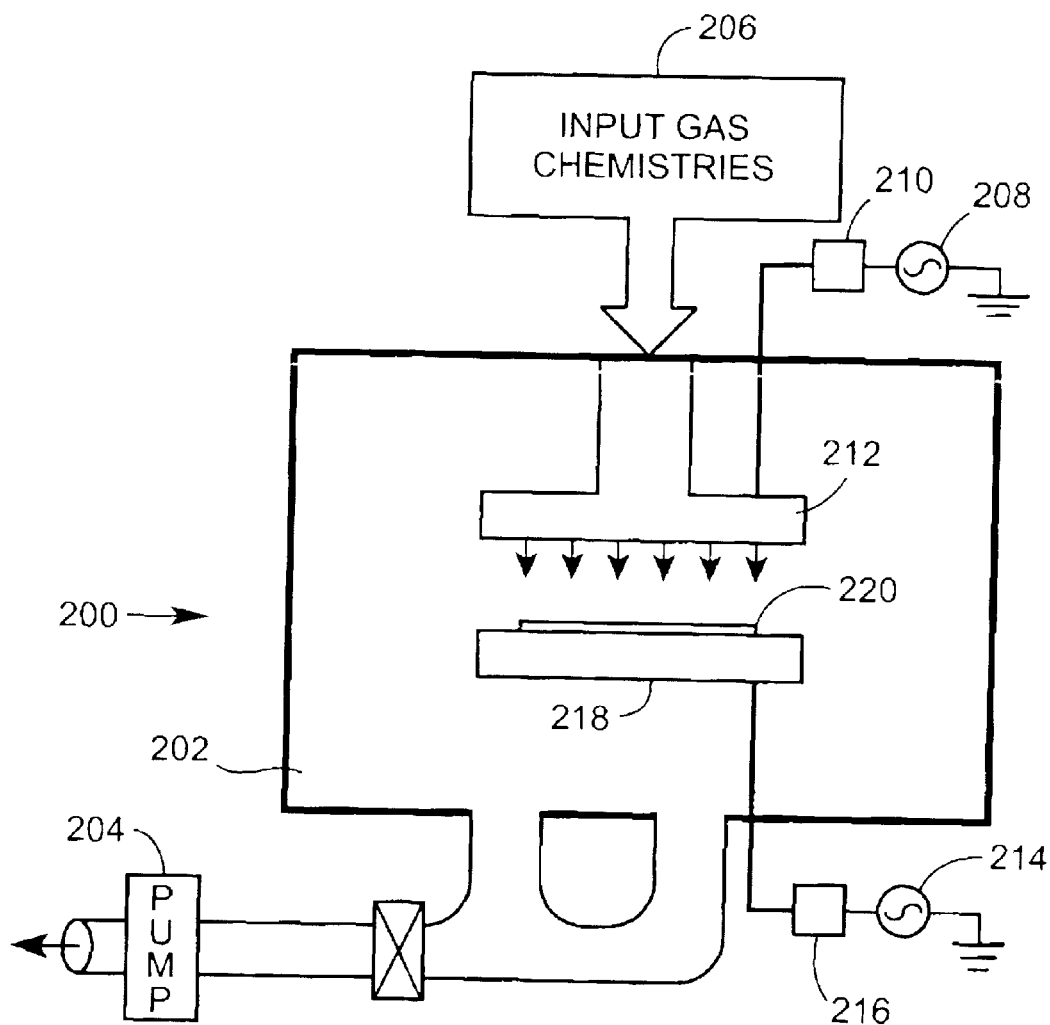
FIG. 5 shows a schematic representation of a medium density parallel plate plasma reactor which can be used to carry out the process of the invention.

The process of the invention can also be carried out in a parallel plate plasma reactor such as reactor 200 shown in FIG. 5. The reactor 200 includes an interior 202 maintained at a desired vacuum pressure by a vacuum pump connected to an outlet 204 in a wall of the reactor. Etching gas can be supplied to a showerhead electrode by supplying gas from gas supply 206. A medium density plasma can be generated in the reactor by supplying RF energy from RF sources 208, 214 to the showerhead electrode and a bottom electrode or the showerhead electrode can be electrically grounded and RF energy at two different frequencies can be supplied to the bottom electrode. Other types of capacitively coupled reactors can also be used, e.g., reactors having only a powered showerhead or only powered by a bottom electrode.

Figure 6A:
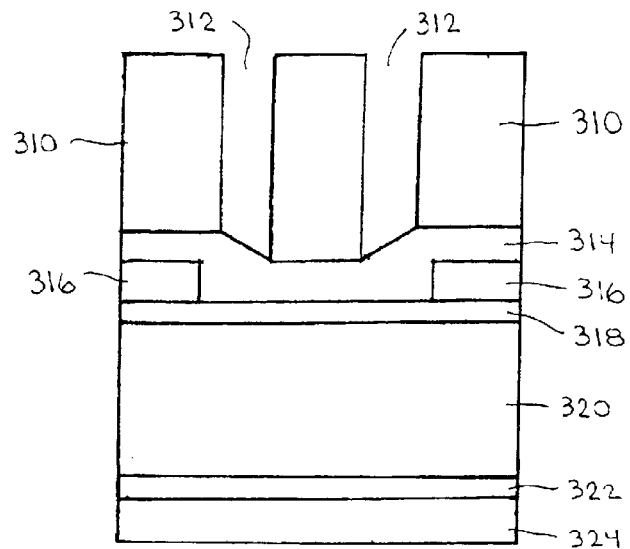
FIGS. 6A–F show schematic representations of a via-first dual-damascene structure which can be etched according to the process of the invention, FIG. 6A showing a pre-etch condition, FIG. 6B showing a post-ARC and silicon nitride mask etch condition, FIG. 6C showing a post-via etch, FIG. 6D showing a post-trough hard mask etch, FIG. 6E showing a post trough dielectric etch, and FIG. 6F showing a post finish etch.
Figure 6B:
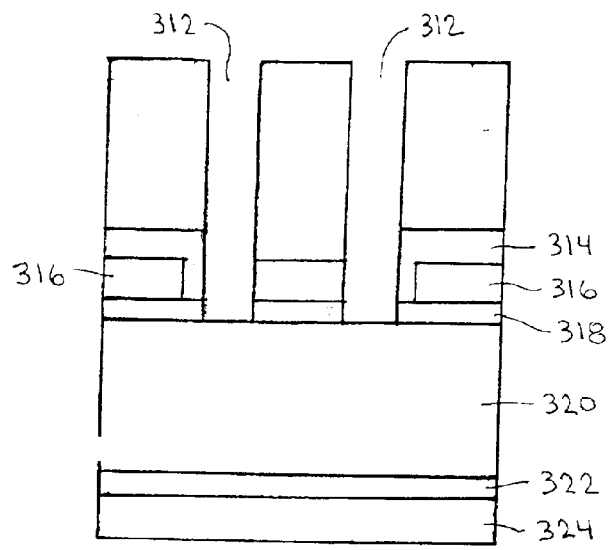
Figure 6C:
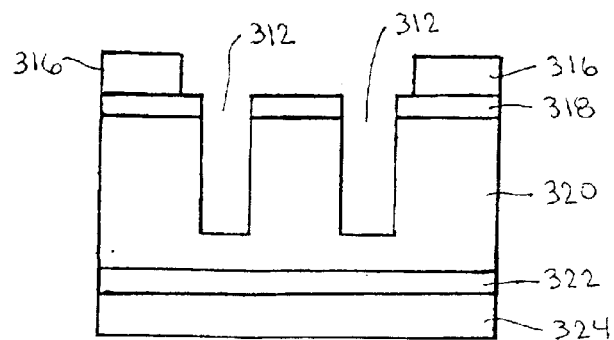
Figure 6D:
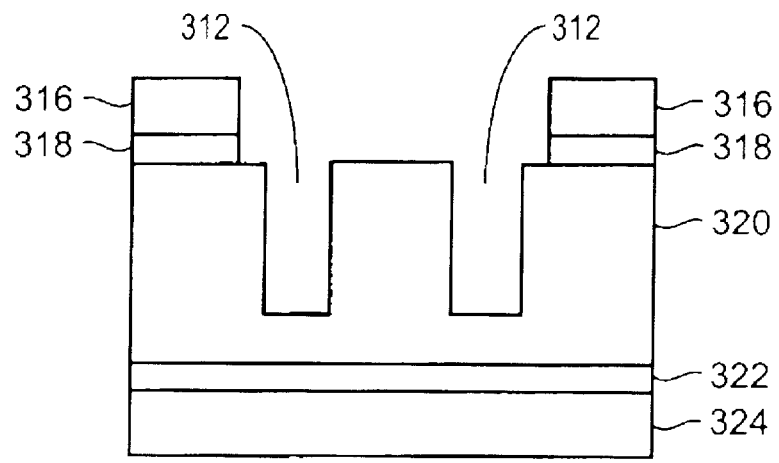
Figure 6E:
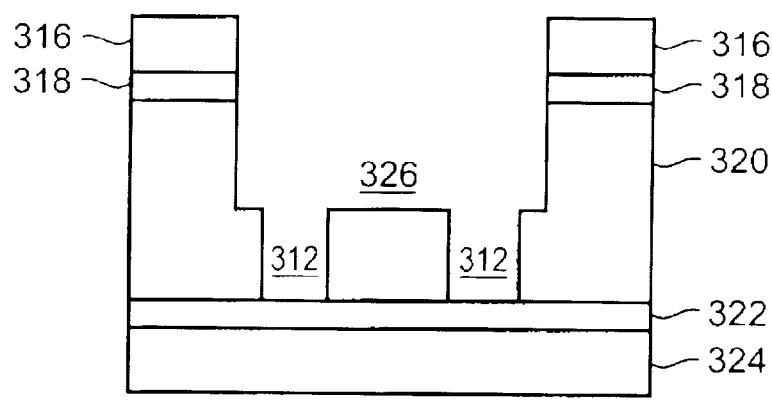
Figure 6F:
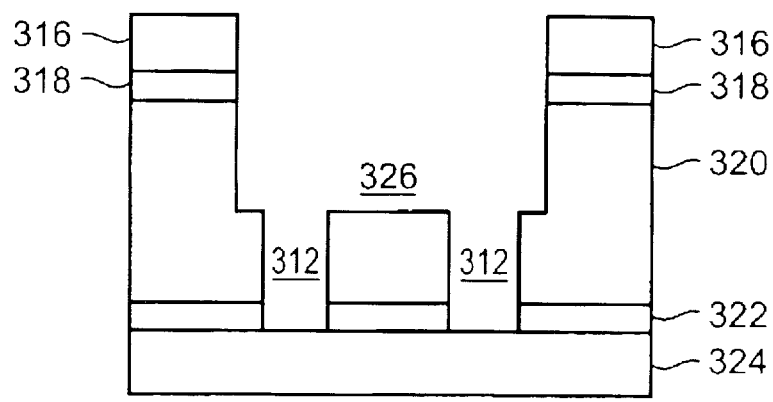

FIGS. 6A–F show schematic representations of a via-first dual-damascene structure which can be etched according to the process of the invention. FIG. 6A shows a pre-etch condition wherein a 5200 Å photoresist 310 patterned with vias 312 overlies layers of a 600 Å organic ARC 314, a 1500 Å oxide layer 316 patterned with a trench, a 400 Å silicon nitride hard mask 318, a 7000 Å low-k dielectric layer of SiLK 320, a 400 Å silicon nitride layer 322 and a copper layer 324. FIG. 6B shows a post-ARC and silicon nitride mask etch condition in which the vias 312 are etched through the organic ARC 314 and silicon nitride layer 318. FIG. 6C shows a post-via etch in which the photoresist is removed and the vias 312 are etched partially through the dielectric layer 320. FIG. 6D shows a post-trough hard mask etch wherein the silicon nitride hard mask 318 is etched directly below the oxide layer 318 and removed from a portion of the dielectric layer 320 in the area between the vias 312. FIG. 6E shows a post trough dielectric etch wherein the vias 312 are opened to the second nitride layer 322 and trench 326 is located at a depth of about 3500 Å in the dielectric layer 320. FIG. 6F shows a post finish etch wherein the vias 312 are opened to the copper layer 324.

The structures shown in FIGS. 1–3 and 6 contain one or more silicon nitride layers which can be etched in accordance with the invention. During etching of the silicon nitride, the plasma will be exposed to underlying and/or overlying dielectric material such as doped or undoped silicon oxide material and/or low-k material. In order to maintain a desired etch rate selectivity, the nitride etch gas includes at least one fluorocarbon reactant and at least one oxygen reactant with a flow rate of oxygen reactant to fluorocarbon reactant of 1.5 or less. A preferred hydrocarbon is $CH_3F$ which produces an extremely low level of $CF_2$ (the major source causing polymer buildup) compared to other fluorocarbon gases. Thus, when $CH_3F$ is used, there is no need to use an excessive amount of $O_2$ to prevent etch stop which might otherwise occur in an overlying dielectric layer such as an organic low-k material such as SiLK. The silicon nitride etch chemistry also offers etch rate selectivity with respect to adjacent layers such as copper.

The at least one fluorocarbon reactant is represented by $C_xF_yH_z$ wherein x is at least 1, y is at least 1 and z is 0 or above, e.g., $CF_4$, $C_3F_6$, $C_3F_8$, $C_5F_8$, $C_4F_6$, $C_4F_8$, $C_2F_6$, $C_2HF_5$, $CH_3F$, $CH_2F_2$, etc. Although hydrogen containing fluorocarbons are quite polymerizing, the degree of polymerizing can be controlled through the use of a synergistic combination of the oxygen reactant and the fluorocarbon reactant. The amount of fluorocarbon gas to be supplied to the plasma reactor should be sufficient to achieve the desired degree of polymerizing. As an example, oxygen and fluorocarbon reactants can each be supplied at flow rates of 5 to 200 sccm, preferably 15 to 50 sccm, and more preferably 20 to 40 sccm. For 0.25 $\mu$m diameter contact openings, the oxygen reactant flow rate can range from 10 to 50 sccm when $C_xF_yH_z$ can be supplied at 10 to 50 sccm, and argon and/or nitrogen, if supplied, can range from 50 to 500 sccm. Argon is a useful addition in that it can provide a more uniform plasma. Other inert gases such as He, Ne, Kr and/or Xe can also be used. Further, while a preferred etch gas is nitrogen-free, nitrogen can be used to supplement or replace Ar in the etch gas. It will be apparent to those skilled in the art that the flow rates of the various gases will depend on factors such as the size of the substrate, the type of plasma reactor, the power settings, the vacuum pressure in the reactor, the dissociation rate for the plasma source, etc.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 30 mTorr, more preferably below 10 mTorr. For medium density plasma reactors, the reactor is preferably at a pressure above 30 mTorr, more preferably above 80 mTorr. Due to plasma confinement at the semiconductor substrate undergoing etching, the vacuum pressure at the substrate surface may be higher than the vacuum pressure setting for the reactor. In order to provide anisotropic etching, it is beneficial to supply an RF bias to the semiconductor substrate by a bottom electrode on which the substrate is supported. For instance, an RF biasing electrode on the substrate support can be supplied with power on the order of 50 to 1000 watts to adequately RF bias 6, 8 or 12 inch wafers.

The substrate support supporting the semiconductor substrate undergoing etching preferably cools the substrate enough to prevent burning of any photoresist on the substrate, e.g., maintain the substrate below 140° C. In high and medium density plasma reactors, it is sufficient to cool the substrate support to a temperature of −20 to 40° C. The substrate support can include a bottom electrode for supplying an RF bias to the substrate during processing thereof and an ESC for clamping the substrate. For example, the substrate can comprise a silicon wafer which is electrostatically clamped and cooled by supplying helium at a desired pressure between the wafer and top surface of the ESC. In order to maintain the wafer at a desired temperature of, for example, 0 to 100° C., the He can be maintained at a pressure of 2 to 30 Torr in the space between the wafer and the The process of the invention is especially well suited for etching silicon nitride in deep and narrow openings as well as wide and shallow features using silicon oxide as a masking layer. The silicon nitride can overly conductive, semiconductive or dielectric layers such as organic low-k materials.

The following Table 1 sets forth results of etching a silicon nitride layer using a dual frequency plasma etch reactor wherein the reactor conditions were set as follows: 200 mTorr reactor pressure, 500 watts 27 MHz and 100 watts 2 MHz power, 20 to 40° C. bottom electrode temperature, 60 second etch time, with variations in etch gas chemistry as listed in the table. Etch rates (ER) of the nitride and oxide layers were calculated from 9-points/wafer Rudolph (Ellipsometry) measurements.

TABLE 1

| Run | $CH_3F$ (sccm) | $CHF_3$ (sccm) | $O_2$ (sccm) | $N_2$ (sccm) | Ar (sccm) | Nitride ER (A/min) | Oxide ER (A/min) | Oxide:Nitride Selectivity |
|---|---|---|---|---|---|---|---|---|
| 1 | 40 | 30 | 10 | 200 | 200 | 624 | 910 | 0.69 |
| 2 | 0 | 60 | 50 | 200 | 0 | 1668 | 825 | 2.02 |
| 3 | 0 | 60 | 10 | 0 | 0 | 1058 | 1488 | 0.71 |
| 4 | 5 | 60 | 50 | 0 | 200 | 2300 | 991 | 2.32 |
| 5 | 0 | 60 | 10 | 200 | 200 | 1027 | 923 | 1.11 |
| 6 | 40 | 30 | 10 | 0 | 0 | dep. | Dep. | NA |
| 7 | 40 | 30 | 50 | 0 | 200 | 1160 | 283 | 4.10 |
| 8 | 40 | 60 | 10 | 200 | 0 | dep. | dep. | NA |
| 9 | 0 | 30 | 10 | 0 | 200 | 1421 | 728 | 1.95 |
| 10 | 20 | 45 | 30 | 100 | 100 | 984 | 1418 | 0.69 |
| 11 | 0 | 30 | 50 | 0 | 0/0 | 1839 | 1049 | 1.75 |
| 12 | 40 | 60 | 50 | 0 | 0/0 | 902 | 489 | 1.84 |
| 13 | 20 | 45 | 30 | 100 | 100 | 985 | 1434 | 0.69 |
| 14 | 0 | 30 | 50 | 200 | 200 | 458 | 585 | 0.78 |
| 15 | 40 | 60 | 10 | 0 | 200 | dep. | Dep. | NA |
| 16 | 0 | 30 | 10 | 200 | 0 | 833 | 444 | 1.88 |
| 17 | 40 | 30 | 50 | 200 | 0 | 1026 | 1158 | 0.89 |
| 18 | 40 | 60 | 50 | 200 | 200 | 1082 | 1519 | 0.71 |
| 19 | 0 | 60 | 50 | 200 | 200 | 922 | 813 | 1.13 |
| 20 | 0 | 60 | 50 | 0 | 450 | 1648 | 939 | 1.76 |
| 21 | 40 | 0 | 50 | 0 | 200 | 1215 | 28 | 43.4 |
| 22 | 40 | 0 | 50 | 0 | 200 | 1225 | 29 | 42.2 |
| 23 | 20 | 0 | 25 | 0 | 200 | 756 | 18 | 42.0 |
| 24 | 20 | 0 | 15 | 0 | 200 | 851 | 88 | 9.67 |
| 25 | 25 | 0 | 20 | 0 | 200 | 865 | 50 | 15.12 |

"dep." indicates that the process resulted in deposition

TABLE 2

| Run | $O_2/CH_3F$ flow ratio | Nitride (A/min) | Oxide ER (A/min) | PR ER (A/min) | SiLK ER (A/min) | Nitride to Oxide Sel |
|---|---|---|---|---|---|---|
| 1 | 1.25 | 756 | 18 | 3194 | 2374 | 42 |
| 2 | 0.65 | ‾1000 | ‾100 | 1681 | 1308 | ‾10 |
| 3 | 0.8 | 1149 | 34 | | | 33.8 |
| 4 | 0.8 | 1579 | 155 | | | 10.2 |
| 5 | 0.8 | 851 | 45 | | | 7.6 |

Table 2 sets forth results of etching a silicon wafer having successive layers of 5200 Å photoresist masking layer, 600 Å ARC, 1500 Å oxide, 400 Å nitride, 7000 Å SiLK, and 400 Å nitride using a dual frequency plasma etch reactor wherein the reactor conditions were set as follows: 150 mTorr reactor pressure, 500 watts 27 MHz and 100 watts 2 MHz power, 20 to 40° C. bottom electrode temperature, 60 second etch time with variations in etch gas chemistry as follows: 150 mTorr, 200 sccm Ar, 25 sccm $O_2$, 20 sccm $CH_3F$ in Run 1, 150 mTorr, 200 sccm Ar, 13 sccm $O_2$, 20 sccm $CH_3F$ in Run 2, 150 mTorr, 200 sccm Ar, 20 sccm $O_2$, 25 sccm $CH_3F$ in Run 3; 150 mTorr, 200 sccm Ar, 20 sccm $O_2$, 25 sccm $CH_3F$, 5 sccm $CHF_3$, in Run 4, and 200 sccm Ar, 20 sccm $O_2$, 25 sccm $CH_3F$ in Run 5.

During processing of a semiconductor wafer it may be desired to carry one or more of the following steps: ARC/Via Mask (Nitride) etch wherein it is desired to maintain the critical dimension (CD) while using a thin photoresist and remove any oxide, a SiLK Via Etch wherein it is desired to leave 1000 Å SiLK, a Through Mask Etch (nitride) wherein openings are etched into the nitride with selectivity to oxide layers, a second SiLK Etch wherein it is desired to maintain CD with a smooth front and with minimal faceting, and a Nitride Finish Etch wherein the etch is selective to oxide, SiLK and copper.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process for etching a silicon nitride layer with selectivity to an underlying and/or overlying dielectric layer, comprising:
   introducing a semiconductor substrate into a plasma etching reactor, wherein the plasma reactor comprises a dual frequency parallel plate plasma reactor having a showerhead electrode and a bottom electrode on which the substrate is supported, the bottom electrode being supplied RF energy at two different frequencies or the showerhead electrode being supplied RF energy at a first frequency and the bottom electrode being supplied RF energy at a second frequency which is different from the first frequency, the semiconductor substrate having a layer of silicon nitride and the layer of silicon nitride having an underlying and/or overlying dielectric layer;

supplying etching gas to the plasma etching reactor and energizing the etching gas into a plasma state, the etching gas including $CH_3F$ and $O_2$ supplied to the plasma etching reactor at a flow rate ratio of $O_2$ to $CH_3F$ of 0.65 to 1.5;

etching exposed portions of the silicon nitride layer with the plasma so as to etch openings in the silicon nitride layer with the plasma while providing an etch rate selectivity of the etching rate of the silicon nitride layer to the etching rate of the dielectric layer of at least about 10.

2. The process of claim 1, wherein the dielectric layer comprises a doped or undoped silicon oxide film.

3. The process of claim 1, wherein the etching gas is nitrogen-free.

4. The process of claim 1, wherein the etching gas consists of $CH_3F$ and $O_2$, or $CH_3F$, $O_2$, and Ar.

5. The process of claim 1, wherein the silicon nitride layer overlies or underlies an organic low-k dielectric material.

6. The process of claim 1, wherein the openings are 0.25 micron or smaller sized openings and/or wide open trenches.

7. The process of clam 1, wherein the etching gas includes a carrier gas selected from the group consisting of Ar, He, Ne, Kr, Xe or mixtures thereof.

8. The process of claim 1, wherein the etching gas is nitrogen-free and the flow rate ratio of the $O_2$ to $CH_3F$ is 1 or less.

9. The process of claim 1, wherein the $CH_3F$ is supplied to the plasma reactor at a flow rate of 5 to 200 sccm and the $O_2$ is supplied to the plasma reactor at a flow rate of 5 to 200 sccm.

10. The process of claim 1, further comprising applying an RF bias to the semiconductor substrate during the etching step.

11. The process of claim 1, wherein the silicon nitride layer overlies an electrically conductive or semiconductive layer comprising a metal-containing layer selected from the group consisting of doped and undoped polycrystalline or single crystal silicon, aluminum or alloy thereof, copper or alloy thereof, titanium or alloy thereof, tungsten or alloy thereof, molybdenum or alloy thereof, titanium nitride, titanium silicide, tungsten silicide, cobalt silicide, and molybdenum silicide.

12. The process of claim 1, wherein the etching step is carried out as part of a process of manufacturing a damascene structure.

13. The process of claim 1, further comprising steps of forming a photoresist layer as a masking layer, patterning the photoresist layer to form a plurality of the openings and the etching step forms via or contact openings in the silicon nitride layer.

14. The process of claim 1, wherein the silicon nitride layer is between an overlying dielectric layer and an underlying copper layer, the copper layer being exposed to the plasma in the openings during the etching step.

15. The process of claim 1, wherein the plasma reactor is at a pressure of 5 to 1000 mTorr during the etching step.

16. The process of claim 1, wherein the semiconductor substrate comprises a silicon wafer supported on a bottom electrode and the bottom electrode is maintained at a temperature of 20 to 50° C. during the etching step.

17. The process of claim 1, wherein the plasma reactor is at a pressure above 80 mTorr.

18. The process of claim 1, wherein the $CH_3F$ is supplied to the plasma reactor at a flow rate of 20 to 40 sccm and the $O_2$ is supplied to the plasma reactor at a flow rate of 20 to 40 sccm.

19. A process for etching a silicon nitride layer with selectivity to an underlying and/or overlying dielectric layer, comprising:

introducing a semiconductor substrate into a plasma etching reactor, wherein the plasma reactor comprises a parallel plate plasma reactor having a showerhead electrode and a bottom electrode on which the substrate is supported, the semiconductor substrate having a layer of silicon nitride and the layer of silicon nitride having an underlying and/or overlying dielectric layer;

supplying etching gas to the plasma etching reactor through the showerhead electrode and energizing the etching gas into a plasma state in a gap between the showerhead electrode and the bottom electrode, the etching gas including $CH_3F$ and $O_2$ supplied to the plasma etching reactor at a flow rate ratio of $O_2$ to $CH_3F$ of 0.65 to 1.5;

etching exposed portions of the silicon nitride layer with the plasma so as to etch openings in the silicon nitride layer with the plasma while providing an etch rate selectivity of the etching rate of the silicon nitride layer to the etching rate of the dielectric layer of at least about 10.

20. The process of claim 19, wherein the dielectric layer comprises a doped or undoped silicon oxide film, the etching gas is nitrogen-free, the etching gas consists of $CH_3F$ and $O_2$, or $CH_3F$, $O_2$, and Ar, and the silicon nitride layer overlies or underlies an organic low-k dielectric material.

21. The process of claim 19, wherein the etching gas is nitrogen-free and the flow rate ratio of the $O_2$ to $CH_3F$ is 1 or less, the etching step is carried out as part of a process of manufacturing a damascene structure, and the process includes forming a photoresist layer as a masking layer, patterning the photoresist layer to form a plurality of the openings and the etching step forms via or contact openings in the silicon nitride layer.

22. The process of claim 19, wherein the silicon nitride layer is between an overlying dielectric layer and an underlying copper layer, the copper layer being exposed to the plasma in the openings during the etching step, the plasma reactor is at a pressure of 5 to 1000 mTorr during the etching step, and the semiconductor substrate comprises a silicon wafer supported on a bottom electrode maintained at a temperature of 20 to 50° C. during the etching step.

23. The process of claim 19, wherein the plasma reactor is at a pressure above 80 mTorr, the $CH_3F$ is supplied to the plasma reactor at a flow rate of 20 to 40 sccm and the $O_2$ is supplied to the plasma reactor at a flow rate of 20 to 40 sccm.

24. A process for etching a silicon nitride layer with selectivity to an underlying and/or overlying dielectric layer, comprising:

introducing a semiconductor substrate into a capacitively coupled plasma etching reactor, wherein the plasma reactor includes a showerhead electrode and a bottom electrode on which supports the substrate therein, the semiconductor substrate having a layer of silicon nitride and the layer of silicon nitride having an underlying and/or overlying dielectric layer;

supplying etching gas to the plasma etching reactor through the showerhead electrode and energizing the etching gas into a plasma state in a gap between the showerhead electrode and the bottom electrode, the etching gas including $CH_3F$ and $O_2$ supplied to the plasma etching reactor;

etching exposed portions of the silicon nitride layer with the plasma so as to etch openings in the silicon nitride layer with the plasma while providing an etch rate selectivity of the etching rate of the silicon nitride layer to the etching rate of the dielectric layer of at least about 5.

25. The process of claim 24, wherein the capacitively coupled plasma etching reactor is at a pressure between about 30 and 200 mTorr.

26. The process of claim 25, wherein the capacitively coupled plasma etching reactor is at a pressure between about 80 and 150 mTorr.

27. The process of claim 24, wherein the etching gas consists of $CH_3F$ and $O_2$, or $CH_3F$, $O_2$, and Ar.

28. The process of claim 24, wherein the $CH_3F$ and $O_2$ are supplied at flow rates of 5 to 200 sccm.

29. The process of claim 24, wherein the $O_2$ is supplied at a flow rate of 15 to 100 sccm and the $CH_3F$ is supplied at a flow rate of 15 to 200 sccm.

30. The process of claim 24, wherein the capacitively coupled plasma etching reactor is a dual frequency parallel plate plasma reactor, wherein energizing the etching gas into a plasma comprises supplying two different frequencies of RF energy to at least one parallel plate electrode in the reactor.

* * * * *